(12) United States Patent
Kwon et al.

(10) Patent No.: US 7,647,884 B2
(45) Date of Patent: Jan. 19, 2010

(54) SLIT COATER WITH A STANDBY UNIT FOR A NOZZLE AND A COATING METHOD USING THE SAME

(75) Inventors: O Jun Kwon, Gyeongsan (KR); Kang Il Cho, Yongin (KR); Ji Seong Noh, Suwon (KR); Jeong Kweon Park, Gumi (KR); Jin Tae Park, Cheongju (KR)

(73) Assignee: LG. Display Co., Ltd., Seoul (KR)

( * ) Notice: Subject to any disclaimer, the term of this patent is extended or adjusted under 35 U.S.C. 154(b) by 742 days.

(21) Appl. No.: 11/211,214

(22) Filed: Aug. 19, 2005

(65) Prior Publication Data

US 2006/0147620 A1    Jul. 6, 2006

(30) Foreign Application Priority Data

Dec. 31, 2004    (KR) .................... 10-2004-0118444

(51) Int. Cl.
    *B05C 5/02*    (2006.01)
(52) U.S. Cl. .................... 118/302; 134/104.1; 134/200; 347/28; 347/29
(58) Field of Classification Search ................. 118/302; 134/104.1, 200, 183, 199; 347/28, 29; 101/423, 101/424
    See application file for complete search history.

(56) References Cited

U.S. PATENT DOCUMENTS

| 5,167,837 | A | | 12/1992 | Snodgrass et al. |
| 5,669,974 | A | * | 9/1997 | Cueller et al. ............... 118/686 |
| 6,319,323 | B1 | | 11/2001 | Gibson et al. |
| 6,475,282 | B1 | | 11/2002 | Snodgrass et al. |
| 6,488,041 | B1 | | 12/2002 | Gibson et al. |
| 6,540,833 | B1 | | 4/2003 | Gibson et al. |
| 6,548,115 | B1 | | 4/2003 | Gibson et al. |

FOREIGN PATENT DOCUMENTS

| JP | 64-032680 | 2/1989 |
| JP | 01-164474 | 6/1989 |
| JP | 07-080385 | 3/1995 |
| JP | 07-171479 | 7/1995 |
| JP | 07-185434 | 7/1995 |
| JP | 07-185437 | 7/1995 |
| JP | 07-326564 | 12/1995 |
| JP | 08-150359 | 6/1996 |
| JP | 08-155365 | 6/1996 |
| JP | 08-173878 | 7/1996 |
| JP | 09-131561 | 5/1997 |
| JP | 09-164357 | 6/1997 |
| JP | 09-192566 | 7/1997 |

(Continued)

OTHER PUBLICATIONS

Office Action dated Sep. 26, 2006 for corresponding Korean Patent Application No. 10-2004-0118444.

*Primary Examiner*—Laura Edwards
(74) *Attorney, Agent, or Firm*—Brinks Hofer Gilson & Lione

(57) ABSTRACT

A slit coater with a standby unit for a nozzle and a coating method using the same prevents environmental pollution by solvent steam and simultaneously maintains the slit nozzle in an optimum state. When in standby and not performing a coating application, the slit nozzle is kept in a standby unit having a solvent atmosphere therein. The slit coater includes: a table on which an object to be processed is positioned; a slit nozzle for applying a coating solution onto a surface of the object; and a standby unit into which the slit nozzle is loaded when on standby, and having a shutter at the opening thereof to maintain an inner space in a substantially hermetically sealed solvent atmosphere. The atmosphere in the standby unit is configured to prevent hardening of the coating solution in the slit nozzle and thereby maintain the slit nozzle in the optimum state for providing coating applications.

17 Claims, 7 Drawing Sheets

| | FOREIGN PATENT DOCUMENTS | |
|---|---|---|
| JP | 09-206652 | 8/1997 |
| JP | 09-237748 | 9/1997 |
| JP | 09-271705 | 10/1997 |
| JP | 09-330876 | 12/1997 |
| JP | 10-156255 | 6/1998 |
| JP | 10-308338 | 11/1998 |
| JP | 11-154641 | 6/1999 |
| JP | 11-274071 | 10/1999 |
| JP | 2000-135463 | 5/2000 |
| JP | 2000-167469 | 6/2000 |
| JP | 2000-288488 | 10/2000 |
| JP | 2001-26113 * | 1/2001 |
| JP | 2001-103202 | 4/2001 |
| JP | 2001-310147 | 11/2001 |
| JP | 2001-310152 | 11/2001 |
| JP | 2002-015664 | 1/2002 |
| JP | 2002-066432 | 3/2002 |
| JP | 2002-066487 | 3/2002 |
| JP | 2002-113411 | 4/2002 |
| JP | 2002-204996 | 7/2002 |
| JP | 2002-282760 | 10/2002 |
| JP | 2002-346453 | 12/2002 |
| JP | 2003-093944 | 4/2003 |
| JP | 2003-236435 | 8/2003 |
| JP | 2003-245591 | 9/2003 |
| KP | 1019940000157 | 1/1994 |
| KP | 1019950030213 | 11/1995 |
| KP | 101996005857 | 2/1996 |
| KP | 101996021170 | 7/1996 |
| KP | 1019970701099 | 3/1997 |
| KP | 1019970051813 | 7/1997 |
| KP | 1019970063518 | 9/1997 |
| KP | 1019970072019 | 11/1997 |
| KP | 101998063704 | 10/1998 |
| KP | 1019980087322 | 12/1998 |
| KP | 101999029827 | 4/1999 |
| KP | 1020010006575 A | 1/2001 |
| KP | 1020010086065 | 7/2001 |
| KP | 1020020018973 A | 3/2002 |
| KP | 1020020018974 A | 3/2002 |
| KP | 1020020019406 A | 3/2002 |
| KP | 1020020028829 A | 4/2002 |
| KP | 1020020029323 A | 4/2002 |
| KP | 1020020077814 A | 10/2002 |
| KP | 1020020080440 | 10/2002 |
| KP | 1020030003114 A | 1/2003 |
| KP | 1020030011462 A | 2/2003 |
| KP | 1020030011463 A | 2/2003 |
| KP | 1020030045636 A | 6/2003 |

* cited by examiner

SLIT COATER WITH A STANDBY UNIT FOR A NOZZLE AND A COATING METHOD USING THE SAME

PRIORITY CLAIM

This application claims priority to Korean patent application No. 118444/2004, filed Dec. 31, 2004, the disclosure of which is incorporated by reference herein.

TECHNICAL FIELD

The present invention relates, generally, to a slit coater, and more particularly, to a slit coater with a standby unit for a nozzle and a coating method using the same which maintains a slit nozzle in the optimum state when the slit nozzle is not performing an application operation but is on standby for a certain period. The slit coater applies a coating solution such as a photosensitive solution, a development solution, a color filter, or the like onto a surface of a an object to be processed such as a substrate for a flat panel display (FPD) or a semiconductor wafer.

BACKGROUND

When a flat panel display device or a semiconductor device is fabricated, a process for depositing a thin film, a photolithography process for exposing a region selected in the thin film, and an etching process for removing the thin film of the selected region are performed several times. Particularly, the photolithography process includes a coating process for forming a photosensitive film of a photosensitive solution such as a photoresist on a substrate or a wafer, and an exposing and developing process for patterning the photosensitive film by using a mask with a predetermined pattern.

In general, a spray coating method, a roll coating method, a spin coating method, or the like, is used in the coating process for forming a photosensitive film on a substrate and a wafer.

Because the spray coating method and the roll coating method are not suitable to achieve high precision in the uniformity of a coating film and the adjustment of a thickness of the film, the spin coating method is used for high-precision pattern formation.

A spin coater used in the spin coating method will now be described in detail with reference to accompanying drawings.

FIG. 1 is a sectional view which illustrates the structure of a general spin coater.

As shown, the spin coater includes a spin chuck 5 that is connected to a rotating shaft 6. A cover 7 that surrounds the spin chuck 5 and may be opened and closed. A nozzle 4 is placed above the spin chuck 5 and moves into the cover 7 when the cover 7 is opened.

An object 10 to be processed and coated with a photosensitive film is mounted on the spin chuck 5, and a drain valve (not shown) for discharging photosensitive solution, such as photoresist, to the outside is installed at a lower portion of the cover 7.

In order to form a coating film on the predetermined object 10, first, the nozzle 4 of the spin coater having the aforementioned structure is lowered and sprays photosensitive solution onto a surface of the object 10, which has been placed on the spin chuck 5.

When the photosensitive solution is sprayed onto the object 10, the cover 7 is hermetically closed, a motor (M) is rotated, and the rotating shaft 6 connected thereto is rotated, thereby rotating the spin chuck 5 with the object 10 a certain number of times.

When the spin chuck 5 is rotated, the photosensitive solution having sprayed on the surface of the object 10 is spread out by a centrifugal force, thereby applying the photosensitive solution over an entire surface of the object 10.

After the photosensitive solution is applied over the entire surface of the object 10, the applied photosensitive solution is hardened. Then, a predetermined pattern is formed on the surface of the object 10 through exposure and development using a photo mask or the like.

Although the spin coating method using the spin coater is suitable to coat a small object, such as a wafer with a photosensitive film, it is not suitable to coat a large and heavy substrate, such as a flat panel display device having a glass substrate for a liquid crystal display panel with a photosensitive film.

This is because it gets harder to rotate a substrate at a high speed as the substrate gets larger and heavier. Further, damage to the substrate can occur and a lot of energy is consumed when the substrate is rotated at a high speed.

Also, the spin coating method is disadvantageous in that a large amount of photosensitive solution is wasted in comparison with the amount of photosensitive solution used in the photolithography process. In particular, a considerable amount of photosensitive solution is dispersed outside the spin chuck at the time of high-speed rotation, and is wasted. Substantially, the amount of wasted solution is much larger than the amount of solution used for coating, and the dispersed photosensitive solution may form particles that contaminate following thin film forming processes. The particles can also cause environmental pollution.

BRIEF SUMMARY

In accordance with the present invention, as embodied and broadly described herein, there is provided a slit coater having a standby unit comprising: a table on which an object to be processed is positioned; a slit nozzle configured to apply a coating solution onto a surface of the object; and a standby unit into which the slit nozzle can be loaded and having a shutter at an opening in the standby unit to thereby maintain an inner space with a substantially hermetically sealed solvent atmosphere.

In accordance with another aspect of the present invention, there is provided a method for fabricating an LCD device, comprising: coating an object to be processed with a coating solution by using a slit nozzle of a slit coater; monitoring the object to determine when maintenance of the slit coater is needed; when maintenance of the slit coater is needed, opening a shutter in a standby unit configured to maintain a substantially hermetically sealed solvent atmosphere; loading the slit nozzle onto the standby unit in which the shutter is opened when the slit nozzle is on standby; removing the slit nozzle from the standby unit; and closing the shutter of the standby unit.

In accordance with yet another aspect of the present invention, a method of fabricating an LCD device includes using a slit nozzle configured to apply a coating solution onto a surface of an LCD substrate. The LCD substrate is monitored to determine when maintenance of the slit coater is needed. A standby unit is provided that is configured to receive the slit nozzle, wherein the coating solution remains fluid in the nozzle while in the standby unit, and wherein the standby unit has a shutter configured to alternatively create an opening for the slit nozzle and to close the opening to maintain a substantially solvent atmosphere inside the standby unit. The standby unit is used when maintenance is needed.

The foregoing and other features, aspects, and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of a slit coater with a standby unit and a method of coating using the same, examples of which are illustrated in the accompanying drawings.

In general, as mentioned above, a photolithography process is required in the field of semiconductor manufacture and the field of flat panel display device in order to pattern a thin film performing a specific function, for example, an insulation film, a metal thin film, a semiconductor thin film or the like, into a desired form. Here, photosensitive solution such as photoresist, which chemically reacts to light, is used in the photolithography process.

A photosensitive film having a uniform thickness should be formed on a substrate on which a thin film has been formed, so that a defect does not occur during the process. For example, if the photosensitive film has a thickness greater than a designated thickness, a portion of the thin film which should be etched is not etched, and if the photosensitive film has a thickness smaller than the designated thickness, the thin film is excessively etched. Also, the uniform application of the photosensitive solution is one of the most important issues as the substrate becomes larger due to an increase in size of the liquid crystal display panel of a liquid crystal display (LCD) device.

In accordance with an embodiment of the invention, a nozzle method in which a uniform amount of photosensitive solution is applied by using a slit nozzle is employed in place of a related art spinner. A coating apparatus employing such a nozzle method is referred to as a spinless coater because a spinner is not used. Alternatively, the term "slit coater" is used because photosensitive solution is applied through a slit. The slit coater supplies the photosensitive solution through a nozzle having a slit shape with a length longer than its width, and applies the photosensitive solution onto a surface of a substrate in a plane form, which makes the slit coater suitable to apply the photosensitive solution to a large LCD device.

Figure 1:
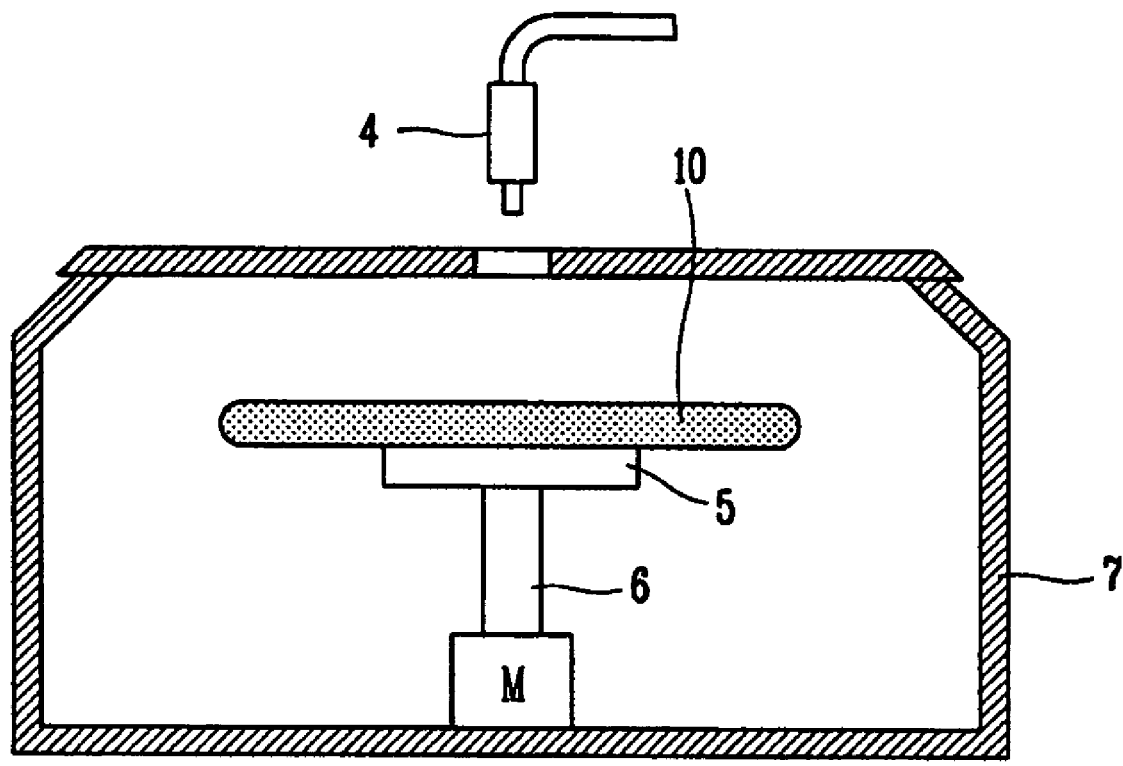
FIG. 1 is a cross-sectional diagram illustrating a structure of a related art spin coater.
Figure 2A:
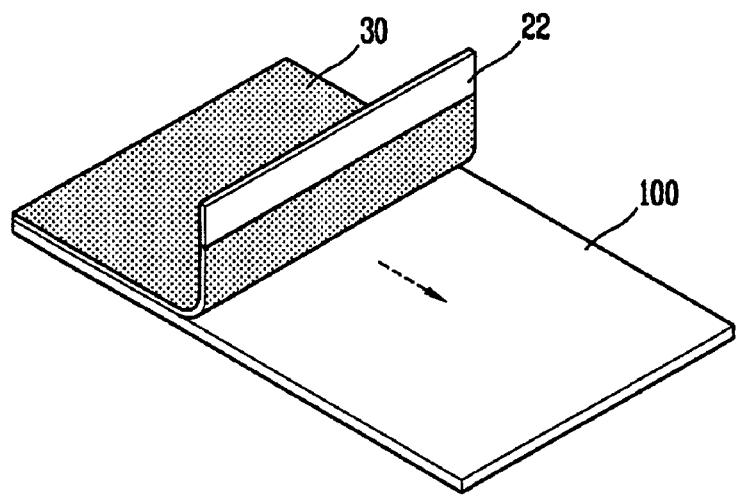
FIGS. 2A and 2B are perspective views which illustrate a slit coater and application of photosensitive solution by the slit coater in accordance with an embodiment of the invention.
Figure 2B:
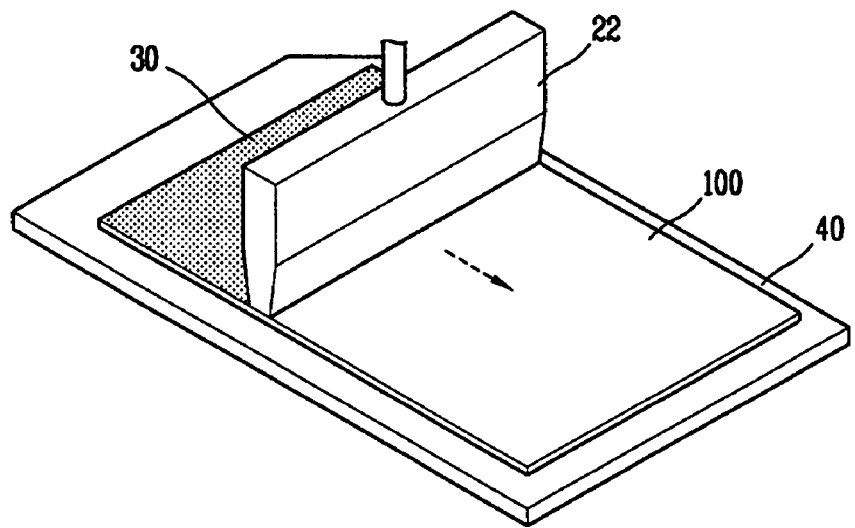

FIGS. 2A and 2B are exemplary views illustrating a slit coater and the application of a photosensitive solution by the slit coater. In accordance with an embodiment of the invention, the slit coater is provided with a slit nozzle 22 having a narrow and long slit. Photosensitive solution 30 is supplied through the slit nozzle 22, thereby applying the photosensitive solution 30 on a surface of a substrate 100 in a plane form.

The slit coater is an apparatus that applies a predetermined amount of photosensitive solution 30 onto the substrate 100 or the like through a bar-shaped long slit nozzle 22. The slit coater applies a uniform amount of photosensitive solution 30 through a fine slit nozzle 22, moving from one side to the other side of the substrate 100 at a constant speed, thereby forming a uniform photosensitive film on the surface of the substrate 100.

Also, because the slit coater may apply the photosensitive solution 30 only to a desired surface of the substrate 100, the coating solution may be used without being wasted as compared to the aforementioned spin coater. In addition, because the slit coater may apply the coating solution in a plane form with a long width, it is suitable for a large substrate or a quadrangular substrate.

For reference, element 40 indicates a table on which the substrate 100 is mounted, and the arrow indicates a direction in which the photosensitive solution 30 is applied along a direction that the slit nozzle 22 moves.

The slit coater of an embodiment of the present invention may maintain the slit nozzle in the optimum state by keeping the slit nozzle in a standby unit in which a substantially solvent atmosphere is formed when a coating process is not performed for a long period and waits for the process. Also, in one aspect of the invention, the substrate is monitored to determine when maintenance of the slit coater is needed.

Figure 3:
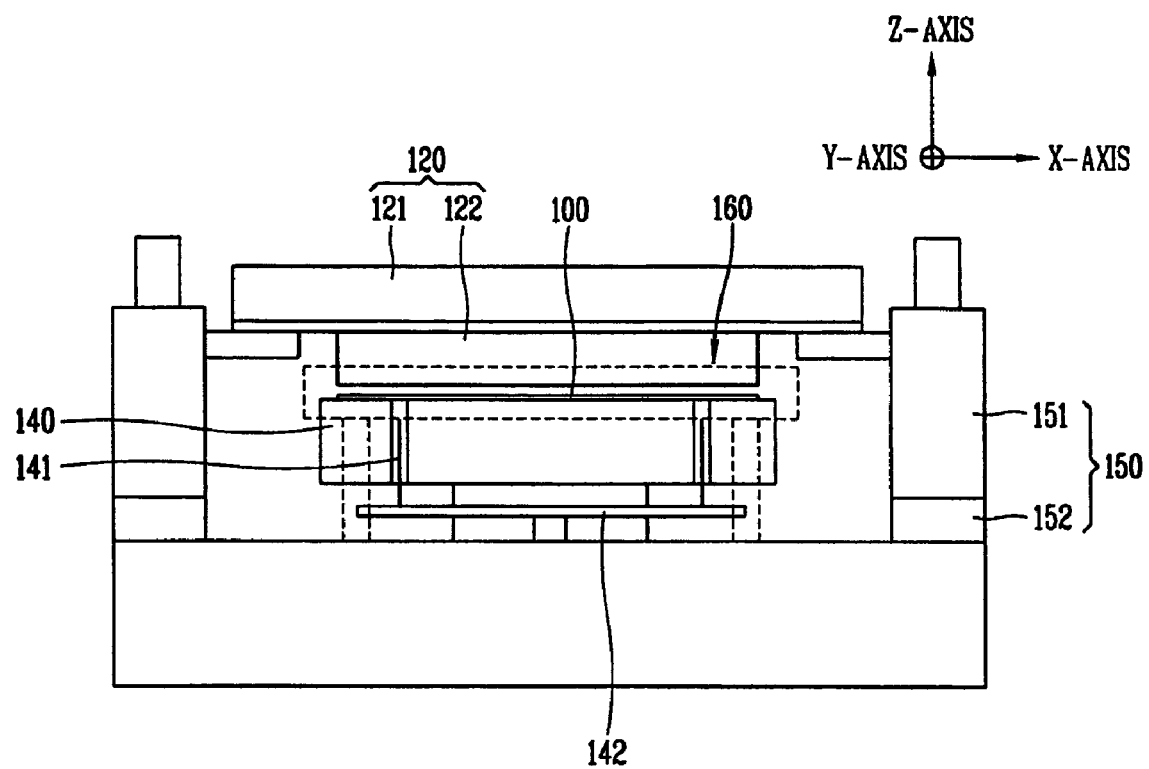
FIG. 3 is a front view schematically illustrating a slit coater having a standby unit in accordance with the present invention.

FIG. 3 is a front view schematically illustrating a slit coater having a standby unit in accordance with the present invention. The slit coater of the present embodiment includes a table 140 on which a substrate 100 is positioned, a slit nozzle unit 120 for applying a coating solution, such as a photosensitive solution like a photoresist, and driving units 150 are installed at both ends of the slit nozzle unit 120 and configured to move the slit nozzle unit 120 at a certain speed.

The driving units 150 include a pair of Z-axis driving apparatuses 151 installed at both ends of the slit nozzle unit 120 and moving the slit nozzle unit 120 in a perpendicular direction and a pair of Y-axis driving apparatuses 152 moving the slit nozzle unit 120 back and forth across the table 140 at a certain speed to uniformly apply the photosensitive solution on a surface of the substrate 100. The Z-axis is the vertical direction pointing directly above or perpendicular to the table 140, the X-axis is the direction between the two sets of driving apparatuses 151, 152 and the Y-axis is in the direction of the plane surface of the table 140. The Z-axial driving apparatuses 151 are configured to move the slit nozzle unit 120 up and down above the table 140, whereas the Y-axial driving apparatuses 152 are configured to move the slit nozzle unit 120 across the length of the table 140.

Each Y-axis driving apparatus 152 may include a motor (not shown) and a transfer unit (not shown) such as a moving rail and a guide rail. A non-contact type linear motor may be used as the motor.

An object to be processed such as a substrate 100 is mounted onto the table 140. A plurality of pins 141 for lifting the substrate 100 up from the table 140 are installed inside the table 140. The pins 141 are supported by a plate 142 located under the table 140 so as to mount or lift the substrate 100 onto or from the table 140 by the vertical movement of the plate 142.

Although not illustrated in the drawing, a preliminary discharge unit for applying an initial coating may be installed at one side of the table 140. The preliminary discharge is used when a coating process is first started or when the coating of another substrate 100 is prepared after the coating process is completed.

The slit nozzle unit 120 includes a nozzle 122 located above the substrate 100, and crossing the substrate 100 and has the shape of a slit with a length corresponding to the width of the substrate 100, and a head 121 on which the slit nozzle 122 is mounted.

Although not illustrated, the slit nozzle 122 includes a nozzle body, an inlet and an outlet. The nozzle body has a receiving space for storing a photosensitive solution therein. The inlet is formed on the nozzle body and the outlet is formed at a lower portion of the nozzle body, which faces the substrate 100. The outlet has the shape of a slit with a length longer than its width.

In addition, the slit nozzle 122 applies photosensitive solution while moving from one side of the substrate 100 toward the other side thereof through the Y-axis driving apparatuses 152 such that photosensitive solution is uniformly coated onto the surface of the substrate 100. Alternatively, in a state where the slit nozzle 122 is fixed, the substrate 100 is slid to thereby perform the same process for applying the photosensitive solution. A bubble outlet (not shown) may be formed on an upper end of the head 121 of the slit nozzle unit 120 and configured to remove bubbles inside the slit nozzle 122.

In the slit coater having such a construction, coating solution in the vicinity of the outlet (not shown) of the slit nozzle 122 is highly concentrated and in contact with air when the slit coater is on standby for a certain period, and not performing the coating process. In some cases, the coating solution in a hardened state remains at the outlet (not shown) of the slit nozzle 122 and causes a defective application when the next operation is performed. Therefore, the substrates are monitored for defects caused by problems in slit coater operation to determine when maintenance of the slit coater is needed.

Accordingly, the slit coater of the present invention further comprises a standby unit 160 forming a substantially solvent atmosphere. The slit coater having the standby unit 160 may prevent the aforementioned problem of the hardened coating solution by preventing contact between the slit nozzle 122 and air by keeping the slit nozzle 122 in the standby unit 160 when the slit nozzle 122 is on standby for a certain period of time. The substantially solvent atmosphere that is used to store the slit nozzle 122 prevents contact of the slit nozzle 122 with outside air. In addition, the standby unit 160 keeps the slit nozzle 122 in a substantially hermetically sealed state because the slit nozzle 122 is isolated from outside air. In the application process of the slit nozzle 122, it is closed and sealed by a shutter, thereby protecting an operator against harmful solvent steam and simultaneously preventing environmental pollution. With reference to the drawings, this will be described in detail. In the drawing, as one embodiment, the standby unit 160 is installed at the front of the table 140. But the present invention is not limited to this, and the standby unit 160 may be installed at a different point on the table 140 including at the rear of the table 140.

Figure 4A:
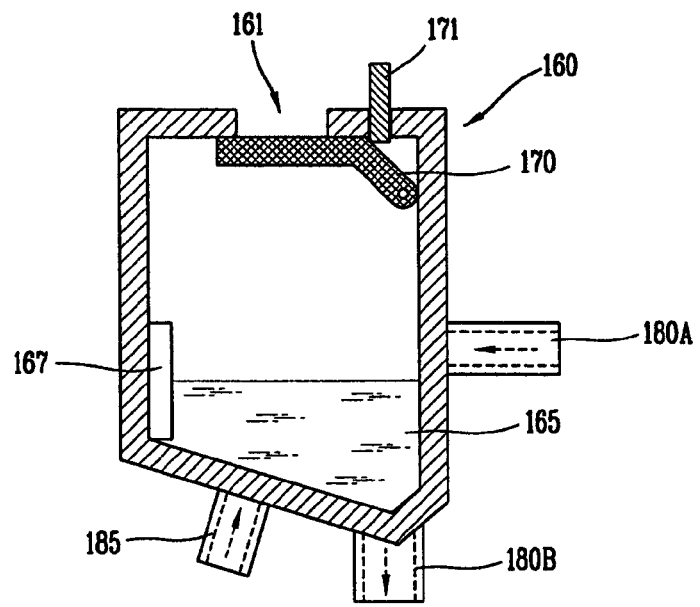
FIGS. 4A and 4B are cross-sectional views schematically illustrating a standby unit in accordance with a first embodiment of the present invention.
Figure 4B:
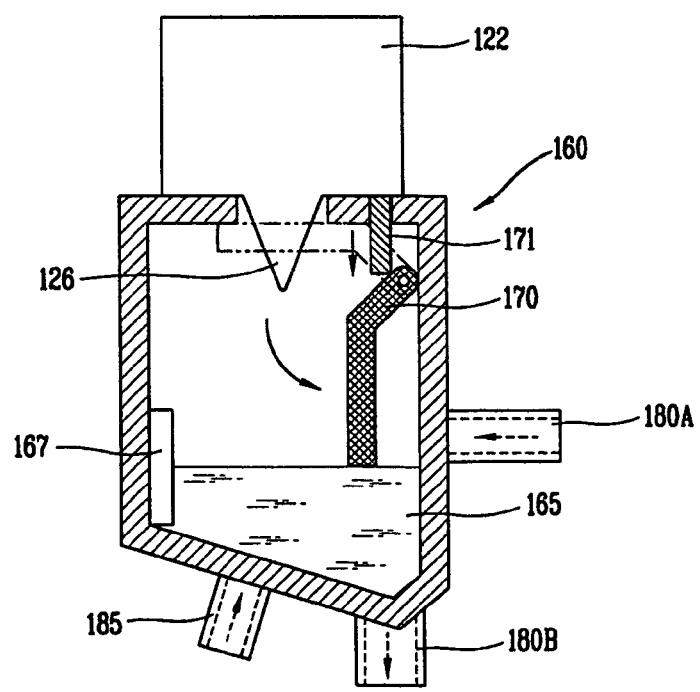

FIGS. 4A and 4B are cross-sectional views schematically illustrating a standby unit of a nozzle in accordance with a first embodiment of the present invention, the cross-sectional views of the side of the standby unit which is illustrated in FIG. 3.

FIG. 4A illustrates a state of the standby unit where a opening is closed by a shutter and the inside is configured to be sealed when the slit nozzle performs an application process. FIG. 4B illustrates a state of the standby unit in which the slit nozzle unit is on standby and therefore the slit nozzle is kept in the standby unit of a substantially solvent atmosphere.

Referring to both FIGS. 4A and 4B, the standby unit 160 of the first embodiment includes a cleaning chamber 165 filled with cleaning solution and allowing the inside of the standby unit 160 to have a substantially solvent atmosphere, and a shutter 170 for opening or closing the opening 161 of the standby unit 160 into which an outlet 126 of the slit nozzle 122 is inserted.

When the slit nozzle 122 performs the application process, as shown in FIG. 4A, the opening 161 of the standby unit 160 into which the outlet 126 of the slit nozzle 122 is inserted is closed by the shutter 170 and the standby unit 160 remains in a sealed state. When the slit nozzle 122 completes the application process and is on standby for a certain period, as shown in FIG. 4B, the shutter 170 is opened and the outlet 126 of the slit nozzle 122 is inserted into the standby unit 160 having the substantially solvent atmosphere therein.

A pin 171 for opening or closing the shutter 170 is installed at one side of the shutter 170. The slit nozzle 122 is positioned on an upper portion of the standby unit 160 of the slit nozzle 122 to thereby press the pin 171 down. By the movement of the pin 171, the shutter 170 is opened and the outlet 126 of the slit nozzle 122 is inserted into the standby unit 160 as shown in FIG. 4B.

In both FIGS. 4A and 4B, a cleaning solution supplying hole 180A the is configured to supply cleaning solution to the cleaning chamber 165 is installed at one side wall of the standby unit 160. A cleaning solution drain hole 180B is configured to drain extra cleaning solution or used cleaning solution is installed under the cleaning chamber 165.

A level sensor 167 is installed at a side wall of the standby unit 160 to measure the remaining amount of the cleaning solution inside the cleaning chamber 165. When the measured remaining amount of the cleaning solution does not reach a pre-set reference value, the cleaning solution is supplied from the cleaning solution supply hole 180A. When the measured remaining amount exceeds the reference value, the extra cleaning solution is drained through the cleaning solution drain hole 180B.

Alternatively, a return line for returning and reusing cleaning solution may be installed instead of the cleaning solution drain hole 180B, and the return line returns the cleaning solution inside the cleaning chamber 165 to the return tank. The cleaning solution returned to the return tank is supplied to the cleaning solution supply hole 180A through the supply line and is reused. Accordingly, waste of the cleaning solution may be prevented by installing the return line and a return tank instead of the cleaning solution drain hole 180B and returning and reusing the cleaning solution.

In addition, a $N_2$ supply hole 185 may be installed at a predetermined area of a lower portion of the cleaning chamber 165 to supply $N_2$ gas to the inside of the cleaning chamber 165, thereby generating $N_2$ bubbling. By performing the $N_2$ bubbling inside the cleaning chamber 165 at regular intervals, a large number of N₂ bubbles are formed inside the cleaning chamber 165. As a result, the standby unit 160 in which the slit nozzle 122 is kept has a dense substantially solvent atmosphere therein.

In addition, though not illustrated in the drawing, a steam spray nozzle for spraying solvent steam may be installed at the side wall of the standby unit 160 such that the standby unit 160 may have a substantially solvent atmosphere created from the steam supplied to the cleaning chamber 165.

An upper surface of the standby unit 160 is sealed except for the opening 161 into which the slit nozzle 122 is inserted. The opening 161 is sealed by the slit nozzle 122 when the slit nozzle 122 is on standby and is inserted into the standby unit 160. The opening 161 is closed by the shutter 170 during the application process of the slit nozzle 122, thereby preventing evaporation of the cleaning solution as much as possible. Accordingly, the inside of the standby unit 160 may be maintained in a dense, substantially solvent atmosphere and leakage of harmful solvent steam to the outside may be prevented.

A packing such as an O-Ring may be inserted between the slit nozzle 122 and the upper surface of the standby unit 160 in order to maintain air tightness and help create a substantially hermetic seal between the standby unit 160 and the slit nozzle 122.

Figure 5:
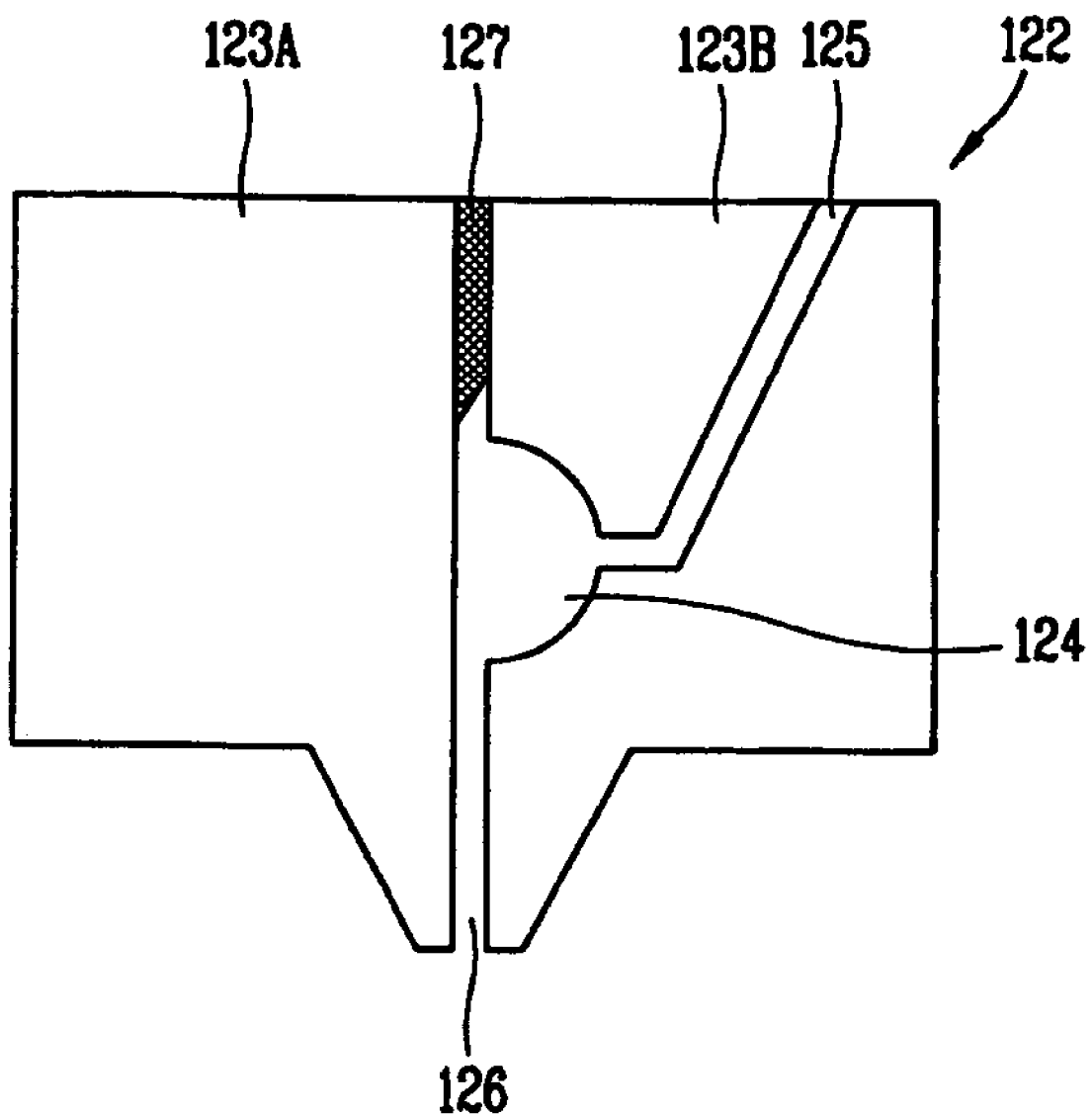
FIG. 5 is a cross-sectional view schematically illustrating a structure of the slit nozzle.

Referring to FIG. 5, the slit nozzle 122 includes a first nozzle body 123A, a second nozzle body 123B, an inlet 125 and an outlet 126. The slit nozzle 122 has a structure comprising two parts of the nozzle bodies 123A and 123B are coupled with each other. A receiving space 124, where a predetermined amount of photosensitive solution is temporarily stored in order to uniformly spray the photosensitive solution pressurized by a pumping unit, is formed between the first nozzle body 123A and the second nozzle body 123B.

The inlet 125 is formed at an upper portion of the second nozzle body 123B to supply photosensitive solution to the receiving space 124. The outlet 126 in the shape of a slit having a length greater than its width is formed at a lower portion of the nozzle bodies 123A and 123B facing the substrate 100 to thereby apply the photosensitive solution in a plane form onto the surface of the substrate 100. In addition, a gap between the first nozzle body 123A and the second nozzle body 123B is created and maintained by a very thin shim 127, preferably made of a stainless steel material.

The standby unit may be applied irrespective of the shape of the shutter or the type of driving method thereof. The shutter should seal the inside and open or close the opening of the standby unit into which the slit nozzle is inserted.

Figure 6A:
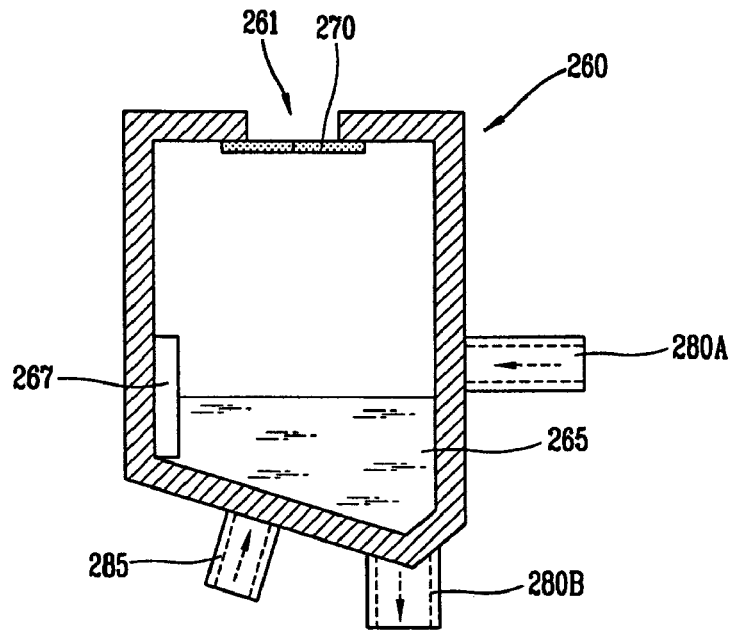
FIGS. 6A and 6B are cross-sectional views schematically illustrating a standby unit in accordance with a second embodiment of the present invention.
Figure 6B:
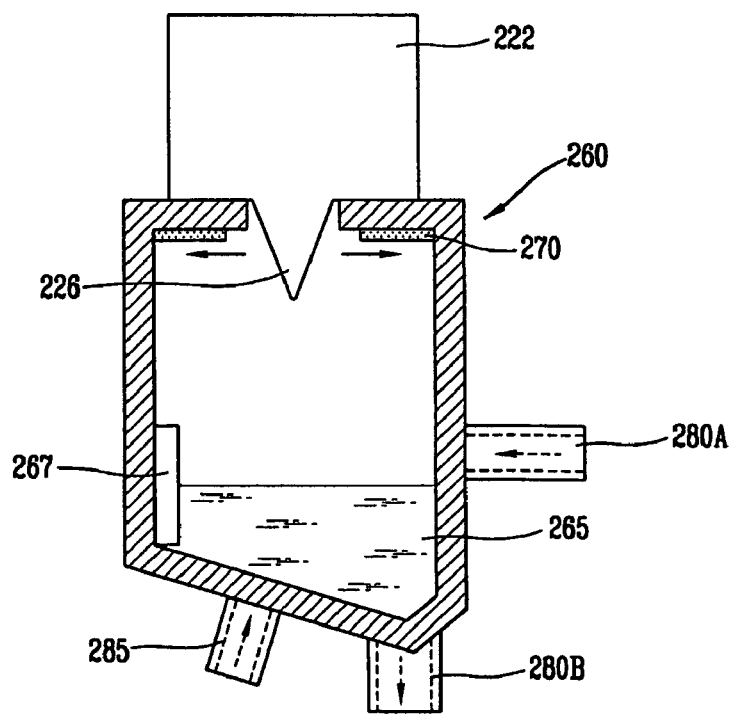

FIGS. 6A and 6B are cross-sectional views schematically illustrating a standby unit in accordance with an alternate embodiment of the present invention, in which standby unit has a similar construction as the first embodiment except for the shape of a shutter and a driving method thereof.

FIG. 6A shows the state in which a slit nozzle performs an application process, and the inside thereof is sealed by closing the opening of the standby unit. FIG. 6B shows the state in which the slit nozzle is on standby and kept in the standby unit with a substantially solvent atmosphere as the slit nozzle.

As shown in both FIGS. 6A and 6B, a standby unit 260 of the second embodiment includes a cleaning chamber 265 filled with cleaning solution and a shutter 270 for opening or closing an upper opening 261 of the standby unit of the nozzle 260.

The shutter 270 is divided into two parts centering around the center of the opening 261 of the standby unit of the nozzle 260, and in a preferred embodiment, has a rectangular shape whose length in the front-rear direction is longer the width. In addition, the shutter 270 is moved in the horizontal direction by a control apparatus (not shown) to thereby open or close the opening 261 of the standby unit of the nozzle 260.

If the slit nozzle 222 performs the application process, as illustrated in FIG. 6A, the opening 261 of the standby unit 260 is closed by the shutter 270 to thereby maintain the standby unit 260 in a sealed state. If the slit nozzle 222 is on standby as illustrated in FIG. 6B, the shutter 270 is opened and an outlet 226 of the slit nozzle 222 is inserted into the standby unit 260 of the solvent atmosphere and is kept therein.

A cleaning solution supply hole 280A configured to supply cleaning solution to a cleaning chamber 265 is installed at one side wall of the standby unit 260. A cleaning solution drain hole 280B configured to drain extra cleaning solution or used cleaning solution is installed at a lower portion of the cleaning chamber 265.

In addition, a level sensor 267 may be installed at a side wall of the standby unit 260 and configured to measure the remaining amount of the cleaning solution inside the cleaning chamber 265. Also, a N₂ supply hole 285 may be installed in the lower portion of the cleaning chamber 265 to generate N₂ bubbling as described above.

The standby units of each embodiment primarily prevent hardening of photosensitive solution in the slit nozzle through the substantially solvent atmosphere inside the sealed standby unit. The atmosphere inside the standby unit prevents the slit nozzle from contacting outside air which would cause the photosensitive solution to harden inside the slit nozzle. The standby unit is configured to have a substantially solvent atmosphere therein from the steam of cleaning solution and the slit nozzle is sealed inside the standby unit with the substantially solvent atmosphere, whereby photosensitive solution inside the slit nozzle is not evaporated by the solvent atmosphere and the slit nozzle may be maintained in the optimum state.

In addition, as described above, the surface of the upper portion of the standby unit is sealed except for the opening into which the slit nozzle is inserted. The opening is sealed by the slit nozzle when the slit nozzle is on standby and the slit nozzle is inserted into the standby unit. The opening is closed by the shutter during the application process of the slit nozzle, which thereby prevents evaporation of the cleaning solution as much as possible, so that the inside of the standby unit of the nozzle is maintained in the dense, substantially solvent atmosphere and external outflow of harmful solvent steam is also prevented.

However, even though the standby unit has a solvent atmosphere therein, hardening of the photosensitive solution may still occur at the outlet of the slit nozzle. If the slit nozzle is left on standby over a certain period of time, the hardening can still occur and thus discharge may not be properly made in a subsequent actual coating process.

Accordingly, by allowing the slit nozzle to discharge dummy photosensitive solution periodically, the aforementioned hardening problem may be solved. That is, if coating solution to be used is a material which is likely to be hardened even in the dense solvent atmosphere, a dummy discharge process can be performed in the slit nozzle at regular time intervals, which will be described in detail with the next alternate embodiment.

Figure 7:
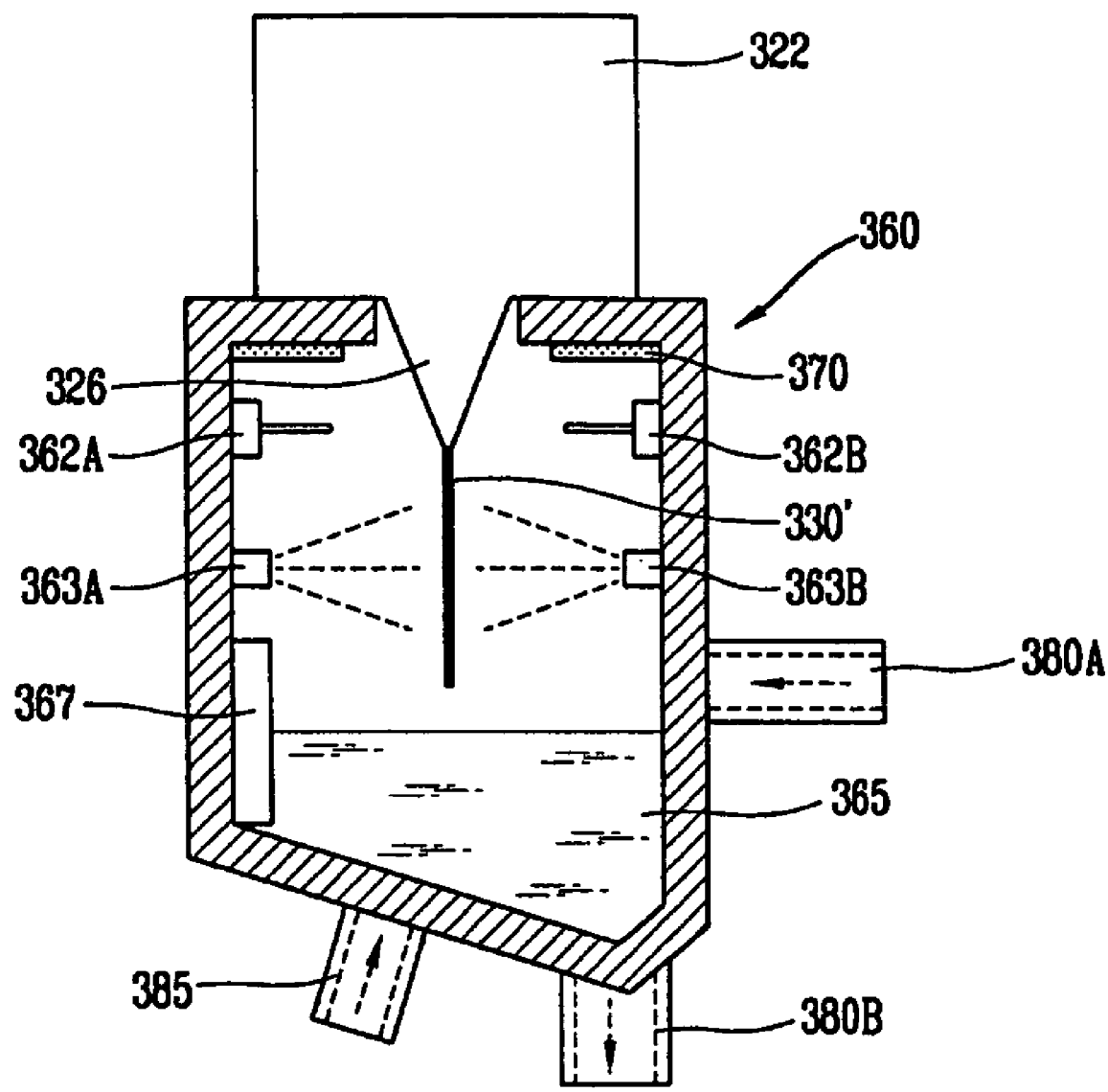
FIG. 7 is a cross-sectional view schematically illustrating a standby unit of a nozzle in accordance with a third embodiment.

FIG. 7 is a cross-sectional view schematically illustrating a standby unit in accordance with an alternate embodiment, in which the standby unit of this embodiment has the same construction as that of the previous embodiments illustrated in FIGS. 6A and 6B, except for the addition of a cleaning solution spray nozzle and a steam spray nozzle.

A standby unit 360 of a third embodiment includes a cleaning chamber 365 filled with a cleaning solution, a shutter 370 for opening or closing the opening of the standby unit 360, and first and second cleaning solution spray nozzles 362A and 362B installed at side walls of the standby unit 360 and configured to spray cleaning solution. The opening of the standby unit 360 is not labeled in FIG. 7, but is shown filled by the slit nozzle 322 and specifically by the outlet 326 of the slit nozzle 322.

The shutter 370 is slidingly moved in a horizontal direction by a control apparatus (not shown) as in the aforementioned embodiment to thereby open or close the opening of the standby unit 360.

A cleaning solution supply hole 380A configured to supply cleaning solution to the cleaning chamber 365 is installed at one side wall of the standby unit 360. A cleaning solution drain hole 380B configured to drain extra cleaning solution or used cleaning solution is installed at a lower portion of the cleaning chamber 365.

A level sensor 367 may be installed at a side wall of the standby unit 360 in order to measure the remaining amount of the cleaning solution inside the cleaning chamber 365. In addition, a $N_2$ supply hole 385 may be installed at a predetermined area of a lower portion of the cleaning chamber 365 to generate $N_2$ bubbling. Also, steam spray nozzles 363A and 363B for spraying solvent steam may be installed at side walls of the standby unit 360 and configured to create a dense solvent atmosphere in the standby unit 360. Here, though not illustrated in the drawing, a sensor for measuring density of solvent steam may be mounted on the side wall such that the steam spray nozzles 363A and 363B are automatically operated or the steam spray nozzles 363A and 363B are periodically operated at set time intervals depending upon the density reading.

Alternatively, a return line for returning and reusing of the cleaning solution may be installed instead of the cleaning solution drain hole 380B. The return line returns the cleaning solution inside the cleaning chamber 365 to a return tank. The cleaning solution returned to the return tank is used again by being supplied to the cleaning solution supply hole 380A through a supply line or by being supplied to the cleaning solution by spray nozzles 362A and 362B or by steam spray nozzles 363A and 363B.

The standby unit 360 is configured to have a substantially solvent atmosphere therein and to keep the slit nozzle 332 therein when it is not applying a coating solution. As described with a previous embodiment, if a coating solution to be used is a material which is likely to be hardened even in a dense solvent atmosphere, the hardening of the coating solution of the slit nozzle 322 may be prevented by discharging a dummy coating solution 330' from the slit nozzle 322 at regular time intervals.

During the discharge of the dummy coating solution 330' of the slit nozzle 322, a side surface of an outlet 326 of the slit nozzle 322 may be contaminated by the dummy coating solution 330'. That is, during the discharge of the dummy coating solution 330' of the slit nozzle 322, the side surface of the outlet 326 may be stained with the dummy coating solution 330' by surface tension. By cleaning the outlet 326 of the slit nozzle 322 by using the cleaning solution spray nozzles 362A and 362B immediately after the discharge, this problem may be solved.

The cleaning solution spray nozzles 362A and 362B may spray the cleaning solution and perform a cleaning of the outlet 326 of the slit nozzle 322, moving in a direction of the slit nozzle 322. In addition, the cleaning solution spray nozzles 362A and 362B may clean the slit nozzle 322 by being installed at the side of the standby unit 360. The first cleaning solution spray nozzle 362A and the second cleaning solution spray nozzle 362B may be installed at the side walls of the standby unit 360 by using a screw member (not shown) as a medium.

The standby unit 360 of the present embodiment keeps the slit nozzle 322 in the solvent atmosphere inside the substantially hermetically sealed standby unit 360 and periodically discharges the dummy coating solution 330' through the slit nozzle 322 to thereby prevent hardening of the coating solution of the slit nozzle 322, such that the slit nozzle 322 may be maintained in the optimum state. When the dummy coating solution 330' is discharged, the side of the outlet 326 of the slit nozzle 322 may be cleaned using the cleaning solution spray nozzles 362A and 362B immediately after the discharge.

Therefore, the slit nozzle 322 may be maintained in the optimum state even though the slit nozzle 322 is on standby for a long period without performing a coating process, and the substrate coating conditions may be kept constant.

As the present invention may be embodied in several forms without departing from the spirit or essential characteristics thereof, it should also be understood that the above-described embodiments are not limited by any of the details of the foregoing description, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A slit coater comprising:
   a table on which an object to be processed is positioned;
   a slit nozzle configured to apply a coating solution onto a surface of the object;
   a standby unit into which the slit nozzle can be loaded, and having a shutter at an opening in the standby unit to thereby maintain an inner space with a substantially hermetically sealed solvent atmosphere; and
   a pin installed at one side of the shutter and configured to drive the shutter for opening or closing the shutter,
   wherein the opening is sealed by the slit nozzle positioned on an upper portion of the standby unit to thereby press the pin down and open the shutter when the slit nozzle is on standby, and the opening is closed by the shutter to thereby maintain the standby unit in a sealed state during an application process of the slit nozzle.

2. The slit coater of claim 1, wherein the shutter is coupled to a sensor configured to detect the approach of the slit nozzle to the shutter and to activate the shutter.

3. The slit coater of claim 1, wherein the coating solution includes one of a photosensitive solution, a development solution or a color filter.

4. The slit coater of claim 1, wherein the slit nozzle has a slit shape with a length longer than its width.

5. The slit coater of claim 1, further comprising:
   a driving unit configured to move the slit nozzle in a predetermined direction.

6. The slit coater of claim 1, wherein the standby unit is installed at a location at one of the front and the rear of the table.

7. The slit coater of claim 1, wherein the shutter is driven by a sensor configured to sense the driving of the slit nozzle.

8. The slit coater of claim 1, further comprising:
   a cleaning solution supply hole configured to supply a cleaning solution into a cleaning chamber of the standby unit.

9. The slit coater of claim 1, further comprising:
a cleaning solution drain hole configured to drain used cleaning solution from a cleaning chamber of the standby unit.

10. The slit coater of claim 1, further comprising:
a $N_2$ supply hole configured to generate $N_2$ bubbling by injecting $N_2$ gas into a cleaning chamber of the standby unit.

11. The slit coater of claim 1, further comprising:
at least one steam spray nozzle installed at a side wall of the standby unit and configured to spray solvent steam into the standby unit.

12. The slit coater of claim 1, further comprising:
a level sensor for measuring the remaining amount of a cleaning solution in a cleaning chamber in the standby unit.

13. The slit coater of claim 1, further comprising:
at least one cleaning solution spray nozzle for spraying a cleaning solution toward an outlet of the slit nozzle configured to clean the outlet of the slit nozzle.

14. The slit coater of claim 1, wherein a cleaning solution is located in the standby unit and the cleaning solution includes high volatile organic solvent.

15. The slit coater of claim 1, further comprising:
a return line installed at a lower part of a cleaning chamber in the standby unit configured to return a cleaning solution and a return tank for storing the cleaning solution returned from the return line.

16. The slit coater of claim 15, further comprising:
a supply line configured to supply the cleaning solution returned from the return tank to the cleaning solution supply hole in order to reuse the returned cleaning solution.

17. A slit coater comprising:
a table on which an object to be processed is positioned;
a slit nozzle configured to apply a coating solution onto a surface of the object; and
a standby unit into which the slit nozzle can be loaded, and having a shutter at an opening in the standby unit to thereby maintain an inner space with a substantially hermetically sealed solvent atmosphere,
wherein the shutter is divided into two parts centering around the center of the opening and the shutter is moved in the horizontal direction by a control apparatus to thereby open or close the opening and
wherein the opening is closed by the shutter to thereby maintain the standby unit in a sealed state during an application process of the slit nozzle, and the shutter is opened and an outlet of the slit nozzle is inserted into the standby unit of the solvent atmosphere and is kept therein when the slit nozzle is on standby.

* * * * *

UNITED STATES PATENT AND TRADEMARK OFFICE
CERTIFICATE OF CORRECTION

PATENT NO. : 7,647,884 B2  Page 1 of 1
APPLICATION NO. : 11/211214
DATED : January 19, 2010
INVENTOR(S) : Kwon et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1188 days.

Signed and Sealed this

Sixteenth Day of November, 2010

David J. Kappos
*Director of the United States Patent and Trademark Office*